US012687871B2

(12) United States Patent
Liu

(10) Patent No.: US 12,687,871 B2
(45) Date of Patent: Jul. 21, 2026

(54) SYSTEMS AND METHODS FOR GENERATING A TEMPERATURE DEPENDENT SUPPLY VOLTAGE

(71) Applicant: Intel Corporation, Santa Clara, CA (US)

(72) Inventor: Ping-Chen Liu, Fremont, CA (US)

(73) Assignee: Altera Corporation, San Jose, CA (US)

( * ) Notice: Subject to any disclaimer, the term of this patent is extended or adjusted under 35 U.S.C. 154(b) by 68 days.

(21) Appl. No.: 17/949,647

(22) Filed: Sep. 21, 2022

(65) Prior Publication Data

US 2023/0008041 A1 Jan. 12, 2023

(51) Int. Cl.
*G05F 1/567* (2006.01)
*G11C 11/41* (2006.01)

(52) U.S. Cl.
CPC .............. *G05F 1/567* (2013.01); *G11C 11/41* (2013.01)

(58) Field of Classification Search
CPC ......... G05F 1/567; G11C 11/41; G11C 5/147; G11C 7/04; H03K 19/17784

USPC ........................................................ 323/281
See application file for complete search history.

(56) References Cited

U.S. PATENT DOCUMENTS

| | | | |
|---|---|---|---|
| 6,744,304 B2 * | 6/2004 | Egerer .................... | G05F 3/225 |
| | | | 327/539 |
| 7,183,794 B2 * | 2/2007 | DiTommaso ............. | G05F 3/30 |
| | | | 326/32 |
| 8,081,532 B2 * | 12/2011 | Walker ................... | G01K 7/425 |
| | | | 361/103 |
| 8,493,043 B2 | 7/2013 | Le et al. | |
| 9,939,827 B1 | 4/2018 | Philpott et al. | |
| 2014/0070777 A1 * | 3/2014 | Wu ........................... | G05F 1/10 |
| | | | 29/25.01 |

* cited by examiner

*Primary Examiner* — Thienvu V Tran
*Assistant Examiner* — Lauren Ashley Shaw
(74) *Attorney, Agent, or Firm* — InventIQ Legal LLP; Steven J. Cahill

(57) ABSTRACT

An integrated circuit includes a diode for generating a temperature dependent voltage, a resistor divider for generating divided voltages by dividing the temperature dependent voltage, and a multiplexer circuit for selecting one of the divided voltages as a reference voltage used for setting a supply voltage.

20 Claims, 4 Drawing Sheets

SYSTEMS AND METHODS FOR GENERATING A TEMPERATURE DEPENDENT SUPPLY VOLTAGE

FIELD OF THE DISCLOSURE

The present disclosure relates to electronic circuits, and more particularly, to systems and methods for generating a temperature dependent supply voltage for an integrated circuit.

BACKGROUND

Electronic integrated circuits often contain volatile memory elements. Volatile memory elements are often based on cross-coupled inverters. Volatile memory elements retain data as long as the integrated circuit is powered. For example, integrated circuits may include volatile memory elements such as static random access memory (SRAM) cells. Integrated circuits such as programmable integrated circuits may include volatile memory elements such as configuration random access memory (CRAM) cells that are loaded with configuration data. Each CRAM cell has an output that provides a control signal that is used to enable or disable a corresponding pass transistor in logic circuitry. Pass transistors (pass gates) are typically formed from n-channel field-effect transistors.

DETAILED DESCRIPTION

In programmable integrated circuits, pass transistors are turned on or off to selectively pass or block the passage of logic signals in response to control signals provided by the configuration random access memory (CRAM) cells. In an effort to increase performance, pass transistors can be turned on using elevated gate control signals. That is, the gates of the pass transistors can be overdriven to an elevated voltage level that is greater than the nominal positive power supply voltage supplied to the remainder of the logic circuitry in the integrated circuit. To provide such overdriving capabilities, power supply circuitry can supply the CRAM cells with an elevated positive power supply voltage.

Pass transistors overdriven in this way may, however, suffer from potential transistor breakdown and reliability issues. Metal-oxide-semiconductor field-effect transistors (MOSFETs) typically exhibit a gate breakdown voltage that varies with temperature. For example, a pass transistor may exhibit a gate breakdown voltage level of 1.1 volts when the integrated circuit is operating at 20° Celsius (C). The same pass transistor may exhibit a gate breakdown voltage of 1.0 volt when the integrated circuit is operating at 50° C. Thus, the gate breakdown voltage level decreases as the temperature increases.

Conventional techniques for overdriving pass transistors involve biasing the gates of pass transistors to the same elevated positive power supply voltage level across all operating temperatures. If an integrated circuit is operating at temperatures below a given threshold, the pass transistors may function satisfactorily. If, however, the integrated circuit is operating at temperatures greater than the given threshold, the pass transistors may suffer from degraded breakdown voltage and may be overstressed, resulting in dielectric breakdown that renders the pass transistors inoperable.

Figure 1:
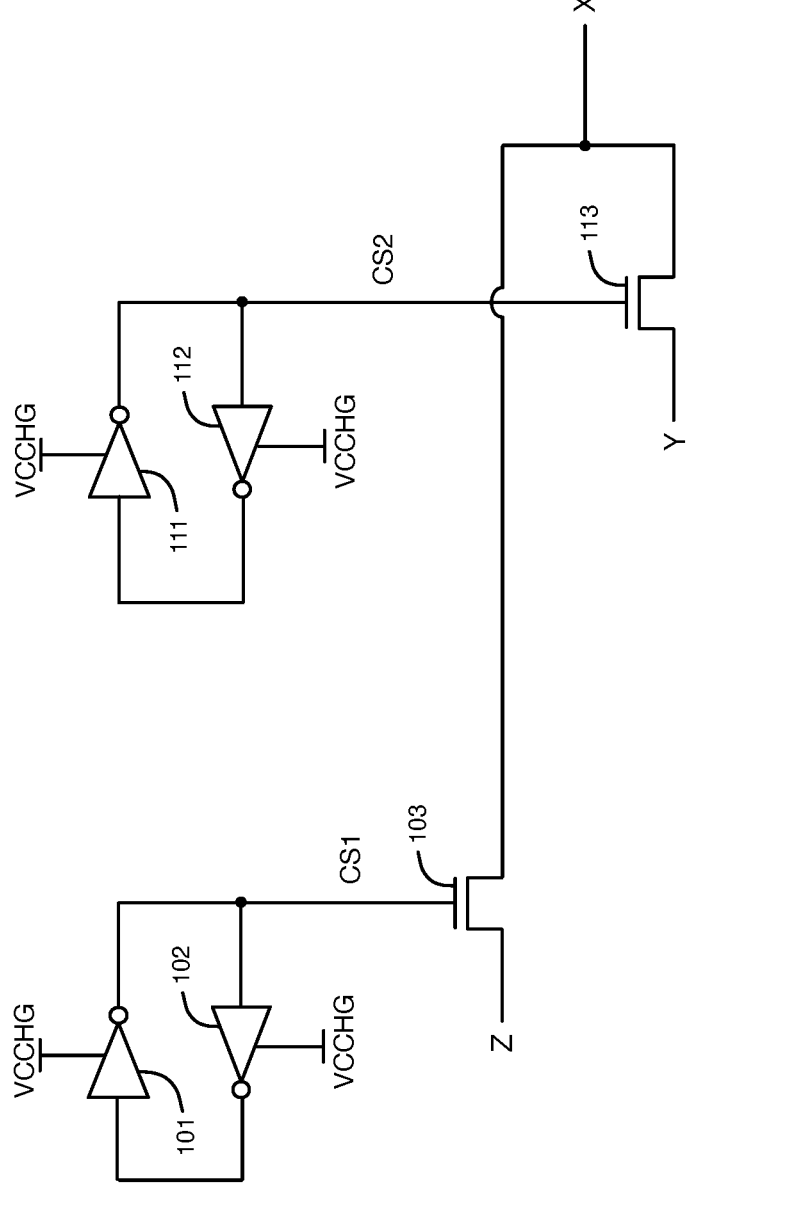
FIG. 1 shows examples of two memory cells in an integrated circuit that control two pass transistors.

FIG. 1 shows examples of two memory cells in an integrated circuit that control two pass transistors. The first memory cell includes a first storage circuit formed by cross-coupled inverter circuits 101-102, and the second memory cell includes a second storage circuit formed by cross-coupled inverters 111-112. The output of each of the cross-coupled inverters is coupled to the input of another one of the cross-coupled inverters, and the input of each of the cross-coupled inverters is coupled to the output of another one of the cross-coupled inverters. A storage circuit formed using this arrangement may be used to store a single bit of data and may sometimes be referred to as a bistable circuit or a latching circuit. The two storage circuits formed by inverters 101-102 and 111-112 can be, for example, CRAM cells in a programmable integrated circuit (IC), such as a field programmable gate array (FPGA).

Each of the inverter circuits 101-102 and 111-112 has a first power supply input that is coupled to a positive power supply line (e.g., a positive power supply line on which power supply voltage VCCHG is provided) and a second power supply input that is coupled to a ground supply line (e.g., a ground line on which a ground voltage is provided). The power supply voltage VCCHG can be greater than a nominal positive power supply voltage that is used to power the remainder of circuits in the integrated circuit. In addition, power supply voltage VCCHG may vary in time depending on the current operating temperature of the integrated circuit. Power supply voltage VCCHG may be referred to as a temperature-dependent time-varying power supply voltage.

The storage circuit formed by inverters 101-102 generates a static output control signal CS1 that controls the gate voltage (and the on/off state) of a pass transistor 103. The pass transistor 103 controls whether a signal is allowed to pass between its source-drain terminals at nodes X and Z. The storage circuit formed by inverters 111-112 generates a static output control signal CS2 that controls the gate voltage (and the on/off state) of a pass transistor 113. The pass transistor 113 controls whether a signal is allowed to pass between its source-drain terminals at nodes X and Y.

The memory cells of FIG. 1 are merely illustrative and are not intended to be limiting. If desired, a memory cell may be formed using more than two cross-coupled inverter or inverter-like circuits, may include any number of access transistors, may include a clear transistor, may include read buffer transistors, may be formed using a multiport memory architecture, etc.

To increase the performance of the pass transistors 103 and 113, the power supply voltage VCCHG that is supplied to the inverter circuits 101-102 and 111-112 can be set to elevated levels that are greater than the nominal power supply voltage used to power the remainder of the circuits in the integrated circuit. Overdriving the pass transistors 103 and 113 by biasing their gate voltages to elevated voltage levels can increase their drive current strengths and operating speed.

Care should be taken not to overstress the pass transistors 103 and 113. At lower temperatures, field effect transistors (FETs), such as transistors 103 and 113, may exhibit relatively robust gate breakdown tolerance (e.g., pass transistors 103 and 113 may be capable of receiving higher voltages at their gates without suffering from dielectric breakdown). At higher temperatures, however, FETs may exhibit degraded gate breakdown tolerance (e.g., pass transistors 103 and 113 are more susceptible to experience reliability issues such as dielectric breakdown when receiving elevated gate voltages at higher temperatures). It may therefore be desirable to provide power supply circuitry configured to generate a temperature dependent power supply voltage VCCHG (e.g., to generate a time-varying power supply voltage that is higher at lower temperatures and lower at higher temperatures).

The power supply voltage VCCHG can be set as high as possible to achieve greater performance and robust read and write operations for the memory cells of FIG. 1. The maximum voltage for supply voltage VCCHG that is allowed for a specific processing node technology used to fabricate the integrated circuit containing the circuitry of FIG. 1 is the maximum voltage that does not cause breakdown of the pass transistors 103 and 113. For example, in a 7 nanometer (nm) processing node for integrated circuits, the maximum voltage for VCCHG can be 1.0 volt at 100° C. The maximum voltage that can be used for the supply voltage VCCHG, without causing breakdown of the pass transistors, increases as the temperature of the integrated circuit decreases. However, a temperature inversion effect causes the transistors in the integrated circuit (such as pass transistors 103 and 113) to operate at slower speeds at lower temperatures.

In order to compensate for this temperature inversion effect of the pass transistors, the supply voltage VCCHG can be driven to greater voltages at lower operating temperatures of the integrated circuit, as described in further detail below. By driving supply voltage VCCHG to greater voltages at lower operating temperatures, the speed of the transistors driven by the memory cells receiving supply voltage VCCHG is limited by a lower maximum voltage for VCCHG at 100° C., but is limited to a greater maximum voltage for VCCHG at lower operating temperatures. As a result, the performance of the integrated circuit is increased, without the need to use external rail temperature dependent voltage identifiers, which reduces cost.

Figure 2:
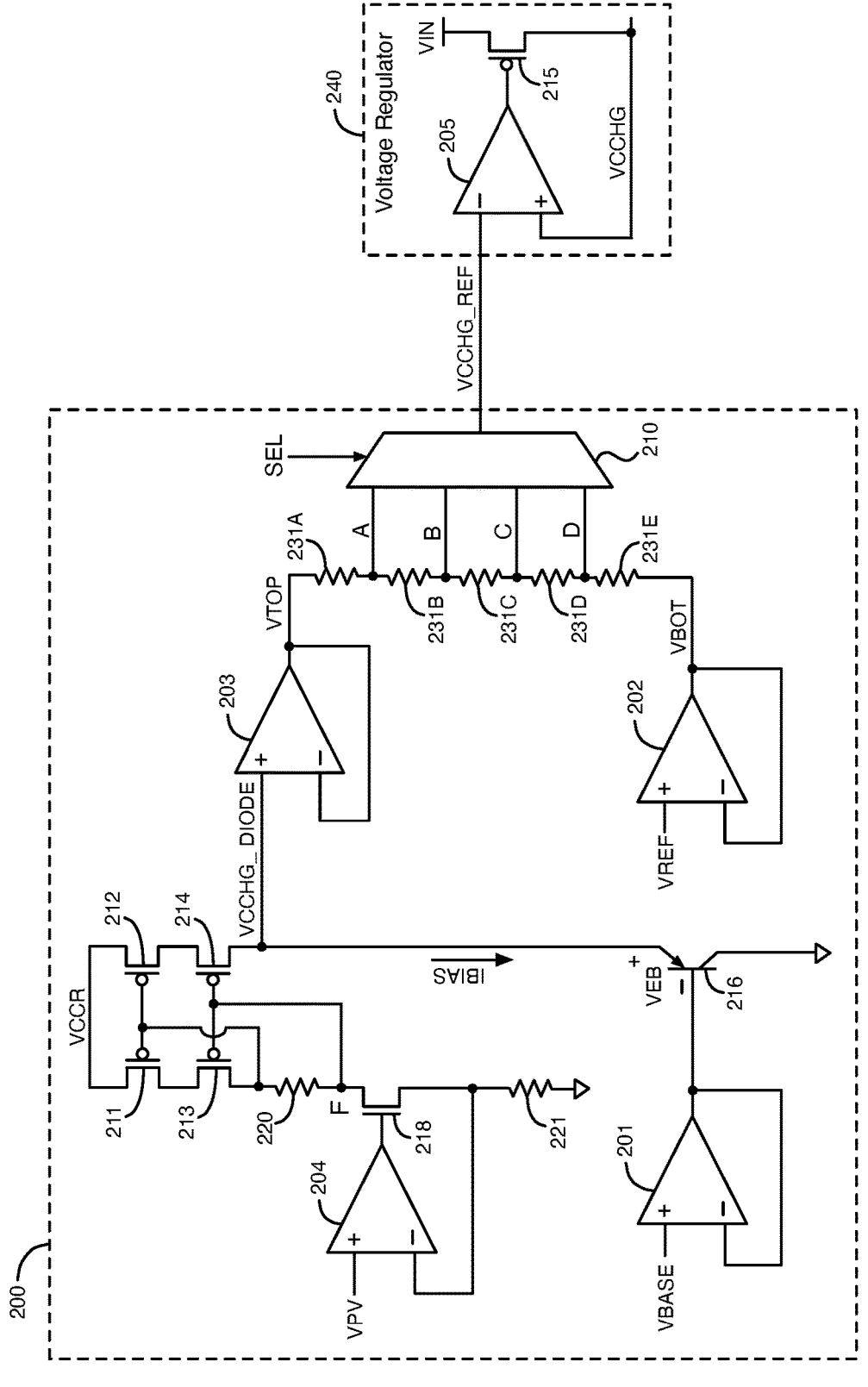
FIG. 2 is a diagram that illustrates an example of a temperature dependent reference circuit for generating a reference voltage that is used by a voltage regulator circuit to generate the supply voltage of FIG. 1.

FIG. 2 is a diagram that illustrates an example of a temperature dependent reference circuit 200 for generating a reference voltage VCCHG_REF that is used by a voltage regulator circuit 240 to generate the supply voltage VCCHG of FIG. 1. In the example of FIG. 2, the temperature dependent reference circuit 200 includes 4 amplifier circuits 201-204, 4 p-channel field-effect transistors (FETs) 211-214, an n-channel field-effect transistor (FET) 218, a PNP bipolar junction (BJT) transistor 216, a multiplexer circuit 210, and resistors 220-221 and 231A-231E. The PNP BJT 216 includes a temperature sensing diode coupled between the base and emitter terminals of PNP BJT 216. The temperature dependent reference circuit 200 causes the reference voltage VCCHG_REF to vary with temperature based on changes in the voltage VEB across the temperature sensing diode in BJT 216 that occur in response to temperature changes in the diode. Voltage regulator circuit 240 causes the supply voltage VCCHG to vary with temperature based on variations in the reference voltage VCCHG_REF that are caused by temperature changes in the diode, as disclosed in further detail below.

The reference circuit 200 and the voltage regulator circuit 240 can be formed in one or more integrated circuits (ICs). The voltage regulator circuit 240 can generate a supply voltage VCCHG for any type of circuit, such as any types of logic gates or memory circuits, to achieve power and performance improvements. The temperature dependent reference circuit 200 and the voltage regulator circuit 240 can be fabricated in any type of one or more integrated circuits (ICs), such as for example, programmable logic ICs, microprocessor ICs, graphics processing unit ICs, application specific ICs, memory ICs, etc. The multiplexer circuit 210 is programmed to select a voltage for reference voltage VCCHG_REF at a node in a resistor divider formed by resistors 231A-231E based on process variations of the integrated circuit, as discussed below.

Voltage regulator circuit 240 includes an amplifier circuit 205 and p-channel FET 215. Voltage regulator circuit 240 is a low dropout (LDO) voltage regulator in the example shown in FIG. 2. However, the temperature dependent reference circuit 200 can be used to generate a reference voltage VCCHG_REF for use by any type of voltage regulator circuit to generate a supply voltage.

The operation of the temperature dependent reference circuit 200 is now described in further detail. A first constant voltage VBASE is provided to a non-inverting input of amplifier circuit 201. Amplifier circuit 201 is a unity gain buffer circuit having its output coupled to its inverting input. Amplifier circuit 201 provides the voltage of VBASE to the base of the PNP BJT 216. The voltage VBASE is selected to cause the voltage VCCHG_DIODE at the emitter of PNP BJT 216 to be a predetermined voltage at a predetermined temperature, based on the voltage VEB at the predetermined temperature. As an example that is not intended to be limiting, the voltage VBASE can be selected to be 0.25 volts if the emitter-base voltage VEB of PNP BJT 216 is 0.75 volts at a temperature of 100° C. to cause voltage VCCHG_DIODE to be a predetermined voltage of 1.0 volt at the predetermined temperature of 100° C. (i.e., 0.25 volts+0.75 volts=1.00 volt at 100° C.). The collector of PNP BJT 216 is coupled to a ground supply line at the ground voltage. The emitter of PNP BJT 216 is coupled to the non-inverting input of amplifier circuit 203 and to the drain of FET 214.

A second constant voltage VPV (e.g., 0.5 volts) is provided to the non-inverting input of amplifier circuit 204. The output of amplifier circuit 204 is coupled to the gate of n-channel FET 218. The source of n-channel FET 218 is coupled to resistor 221 and to the inverting input of amplifier circuit 204. Resistor 221 is coupled between the source of FET 218 and the ground supply line. Resistor 220 is coupled between the drains of FETs 213 and 218. The upper terminal of resistor 220 is coupled between the gates of FETs 211-212, and the lower terminal of resistor 220 is coupled between the gates of FETs 213-214. The sources of FETs 211-212 are coupled to a supply line at a supply voltage VCCR. The drains of FETs 211-212 are coupled to the sources of FETs 213-214, respectively.

Amplifier circuit 204 generates a voltage at the gate of FET 218 that forces the voltage at node F (at the lower terminal of resistor 220) to be close to voltage VPV, thus generating a constant current (about equal to VPV/resistance of resistor 221) to flow from the supply line at voltage VCCR through FETs 211 and 213, resistor 220, FET 218, and resistor 221 to the ground supply line. FETs 211-214 are coupled together to form a current mirror circuit that generates a bias current IBIAS from the supply line at voltage VCCR through FETs 212 and 214 and BJT 216. The current mirror circuit causes the bias current IBIAS to equal a predefined ratio of the current through FETs 211, 213, and 218.

The current mirror circuit formed by FETs 211-214 and the PNP BJT 216 generate the voltage VCCHG_DIODE at the non-inverting input of amplifier circuit 203. The voltage VCCHG_DIODE equals the voltage VBASE at the base of PNP BJT 216 plus the emitter-base voltage VEB of PNP BJT 216 (i.e., VCCHG_DIODE=VBASE+VEB). As discussed above, the emitter-base voltage VEB of PNP BJT 216 varies with variations in the temperature of the emitter-base diode in BJT 216. Therefore, voltage VCCHG_DIODE also varies with variations in the temperature of the emitter-base diode.

Amplifier circuit 203 is also a unity gain buffer circuit having its output coupled to its inverting input. Amplifier circuit 203 provides the voltage of VCCHG_DIODE at its non-inverting input to its output at an upper terminal of resistor 231A as top voltage VTOP. A constant reference voltage VREF is provided to the non-inverting input of the amplifier circuit 202. Voltage VREF is set to equal the predetermined voltage of voltage VCCHG_DIODE at the predetermined temperature. For example, voltage VREF can be set to the maximum voltage for VCCHG that does not cause transistor breakdown in the storage circuits of FIG. 1 at the predetermined temperature. As a specific example that is not intended to be limiting, the voltage VREF can be set to a voltage of 1.0 volt at 100° C. Amplifier circuit 202 is also a unity gain buffer circuit having its output coupled to its inverting input. Amplifier circuit 202 provides the reference voltage VREF at its non-inverting input to its output at a lower terminal of resistor 231E as bottom voltage VBOT.

The five resistors 231A-231E are coupled together in series to form a resistor divider between the outputs of amplifier circuits 202-203. The resistor divider divides the difference between the top and bottom voltages (i.e., VTOP–VBOT) to generate 4 divided voltages at nodes A, B, C, and D at four different data inputs of multiplexer circuit 210, as shown in FIG. 2. The first divided voltage at node A is generated between resistors 231A-231B. The second divided voltage at node B is generated between resistors 231B-231C. The third divided voltage at node C is generated between resistors 231C-231D. The fourth divided voltage at node D is generated between resistors 231D-231E. The voltage at each of nodes A, B, C, or D equals $$\left( (VTOP - VBOT) \times \frac{R2}{(R1 + R2)} \right) + VBOT,$$

where R1 is the resistance between VTOP and the respective node A, B, C, or D, and R2 is the resistance between the respective node A, B, C, or D and VBOT.

Two or more select signals SEL are provided to select inputs of multiplexer circuit 210. Multiplexer circuit 210 selects the voltage (at node A, B, C, or D) at one of its data inputs based on the values of the select signals SEL. Multiplexer circuit 210 provides the voltage selected based on select signals SEL from the selected data input to its output as voltage VCCHG_REF. For example, if the select signals SEL indicate to select the voltage at node A at the first data input, multiplexer circuit 210 provides the voltage at node A to its output as voltage VCCHG_REF. As another example, if the select signals SEL indicate to select the voltage at node B at the second data input, multiplexer circuit 210 provides the voltage at node B to its output as voltage VCCHG_REF. Thus, the voltage VCCHG_REF at the output of multiplexer circuit 210 equals the voltage at node A, B, C, or D selected by the multiplexer circuit 210 based on the values of the select signals SEL.

The voltage VCCHG_REF is provided to the inverting input of amplifier circuit 205 in voltage regulator circuit 240. The output of amplifier circuit 205 is coupled to the gate of p-channel FET 215. The non-inverting input of amplifier circuit 205 is coupled to the drain of FET 215. The source of FET 215 is coupled to receive an input voltage VIN. Voltage regulator circuit 240 generates supply voltage VCCHG at the drain of FET 215 based on voltage VCCHG_REF. In the example of FIG. 2, the voltage regulator circuit 240 causes supply voltage VCCHG to be equal to VCCHG_REF. As a result, the supply voltage VCCHG tracks the variations in voltage VCCHG_REF that are caused by variations in the temperature of the diode in BJT 216 and in the voltage selected by multiplexer circuit 210. In other implementations, a voltage regulator circuit that receives voltage VCCHG_REF can cause voltage VCCHG to have a different ratio with voltage VCCHG_REF.

Figure 3:
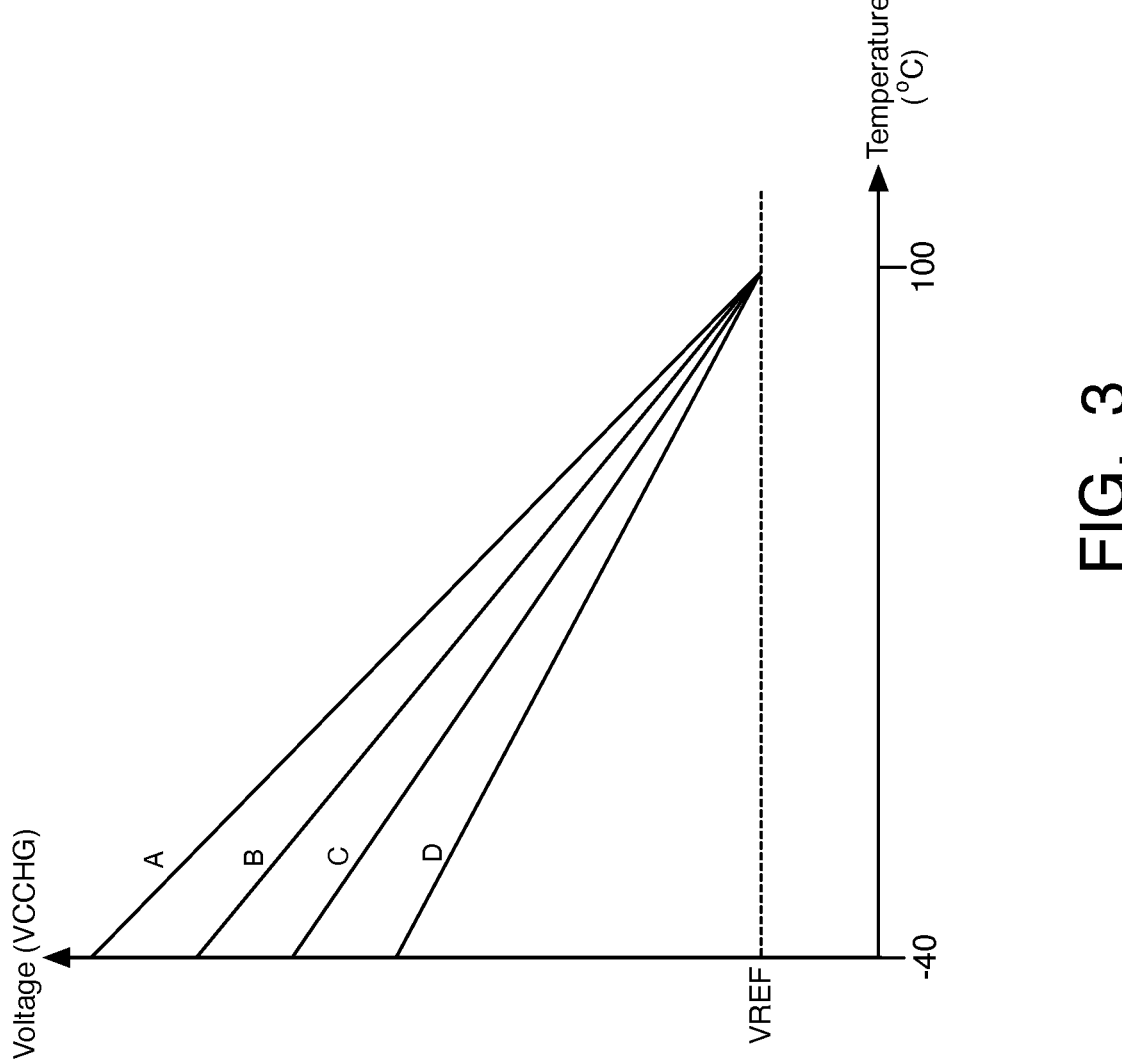
FIG. 3 is a graph that illustrates examples of the supply voltage generated by the circuitry of FIG. 2 over a range of temperatures from −40° C. to 100° C. for 4 divided voltages.

Temperature dependent reference circuit 200 causes its output voltage VCCHG_REF to vary with changes in the emitter-base voltage VEB across the emitter-base diode of BJT 216 that are caused by changes in the temperature of the emitter-base diode. As a result, temperature dependent reference circuit 200 causes voltage VCCHG_REF to vary with changes in the temperature of the emitter-base diode of BJT 216. FIG. 3 is a graph that illustrates examples of voltage VCCHG over a range of temperatures from −40° C. to 100° C. for 4 divided voltages at nodes A, B, C, and D selectable by the multiplexer circuit 210. The four down-sloping lines shown in FIG. 3 labeled A, B, C, and D correspond to the voltage VCCHG over a range of temperatures from −40° C. to 100° C. that voltage regulator circuit 240 generates in response to the voltage VCCHG_REF being selected to equal the voltages at nodes A, B, C, and D, respectively, by the multiplexer circuit 210. Voltage regulator circuit 240 causes the voltage VCCHG to equal voltage VCCHG_REF in the example of FIG. 3.

In the example of FIG. 3, voltage VCCHG_REF equals VREF at 100° C. for each of the voltages at nodes A, B, C, and D selectable by the multiplexer circuit 210, because voltage VREF equals voltage VCCHG_DIODE at 100° C. Thus, at 100° C., no current flows through resistors 231A-231E, because voltage VTOP equals voltage VBOT. As a result, the voltage VCCHG equals voltage VREF at the predetermined temperature of 100° C., regardless of which of the voltages at nodes A, B, C, or D is selected by multiplexer circuit 210.

As the temperature of the emitter-base diode of BJT 216 decreases, the voltage VCCHG_REF and the voltage VCCHG increase, as shown in FIG. 3. The voltages VCCHG_REF and VCCHG increase at different rates in response to the decrease in the temperature (i.e., voltage VCCHG has different slopes) using the 4 different voltages at nodes A, B, C, and D selectable by the multiplexer circuit 210. For example, the slope of the voltage VCCHG is greater when multiplexer circuit 210 selects the voltage at node A as voltage VCCHG_REF than when multiplexer circuit 210 selects any of the voltages at nodes B, C, or D as voltage VCCHG_REF. As another example, the slope of the voltage VCCHG is greater when multiplexer circuit 210 selects the voltage at node B as voltage VCCHG_REF than when multiplexer circuit 210 selects either of the voltages at nodes C or D as voltage VCCHG_REF. The slope of each of the voltages VCCHG_REF and VCCHG equals the slope of the voltage VEB of BJT 216 multiplied by the resistor ratio R2/(R1+R2), where (R1+R2) is total resistance of the resistor divider formed by resistors 231A-231E, R1 is the resistance from the node at VTOP to the data input selected by multiplexer circuit 210 (i.e., the node A, B, C, or D), and R2 is the resistance from the selected data input of multiplexer circuit 210 to the node at VBOT.

In the example of FIG. 3, the voltage VCCHG reaches its maximum voltage at a temperature of −40° C. Thus, the temperature dependent reference circuit 200 compensates for the temperature inversion effect of the transistors in the IC that causes the transistors to operate at slower speeds at colder temperatures by increasing the voltage VCCHG_REF (and voltage VCCHG) in response to the temperature of the emitter-base diode in BJT 216 decreasing, as shown for example in FIG. 3. As a result, temperature dependent reference circuit 200 limits the routing speed of the pass transistors in the IC, such as pass transistors 103 and 113 (and other signal paths driven by memory cells receiving voltage VCCHG), by voltage VREF at the predetermined temperature (e.g., 100° C.), but increases the voltage VCCHG at colder temperatures to compensate for the temperature inversion effect.

The temperature dependent slope of voltage VCCHG can be set during device binning of the IC by selecting the values of the select signals SEL. For example, bits stored in memory cells that generate select signals SEL can be set during device binning. The values of the select signals SEL are selected during device binning to compensate for process variations between different integrated circuits (ICs) that each contain a temperature dependent reference circuit 200. For example, select signals SEL can be set during device binning to cause multiplexer circuit 210 to select the voltage at node A as voltage VCCHG_REF if the IC containing reference circuit 200 and voltage regulator circuit 240 has slow (SS) process corners. As another example, select signals SEL can be set during device binning to cause multiplexer circuit 210 to select the voltage at node D as voltage VCCHG_REF if the IC containing reference circuit 200 and voltage regulator circuit 240 has fast (FF) process corners. By selecting different data inputs of the multiplexer circuit 210 that are coupled to different tap points of the resistor divider, the reference voltage VCCHG_REF can be adjusted for different process corners. As a result, the slope of VCCHG is adjusted for different process corners using the temperature dependent voltage slope of the emitter-base voltage VEB of the emitter-base diode of BJT 216.

The temperature dependent reference circuit 200 can be used to provide an optimized on-die temperature dependent supply voltage VCCHG that is based on the processing parameters of the IC. As a result, the temperature dependent reference circuit 200 enables the IC to achieve a greater power and performance advantage by compensating for the temperature inversion effect of the transistors at cold temperatures, without causing hold time violations in the transistors. The temperature dependent reference circuit 200 also eliminates the need to use external supply rail temperature dependent voltage identifiers, which can reduce the cost of the IC (e.g., by reducing circuit board voltage regulator complexity). The temperature dependent reference circuit 200 can be used with any type of voltage regulator circuit to generate a supply voltage for any types of circuits in any type of IC.

Figure 4:
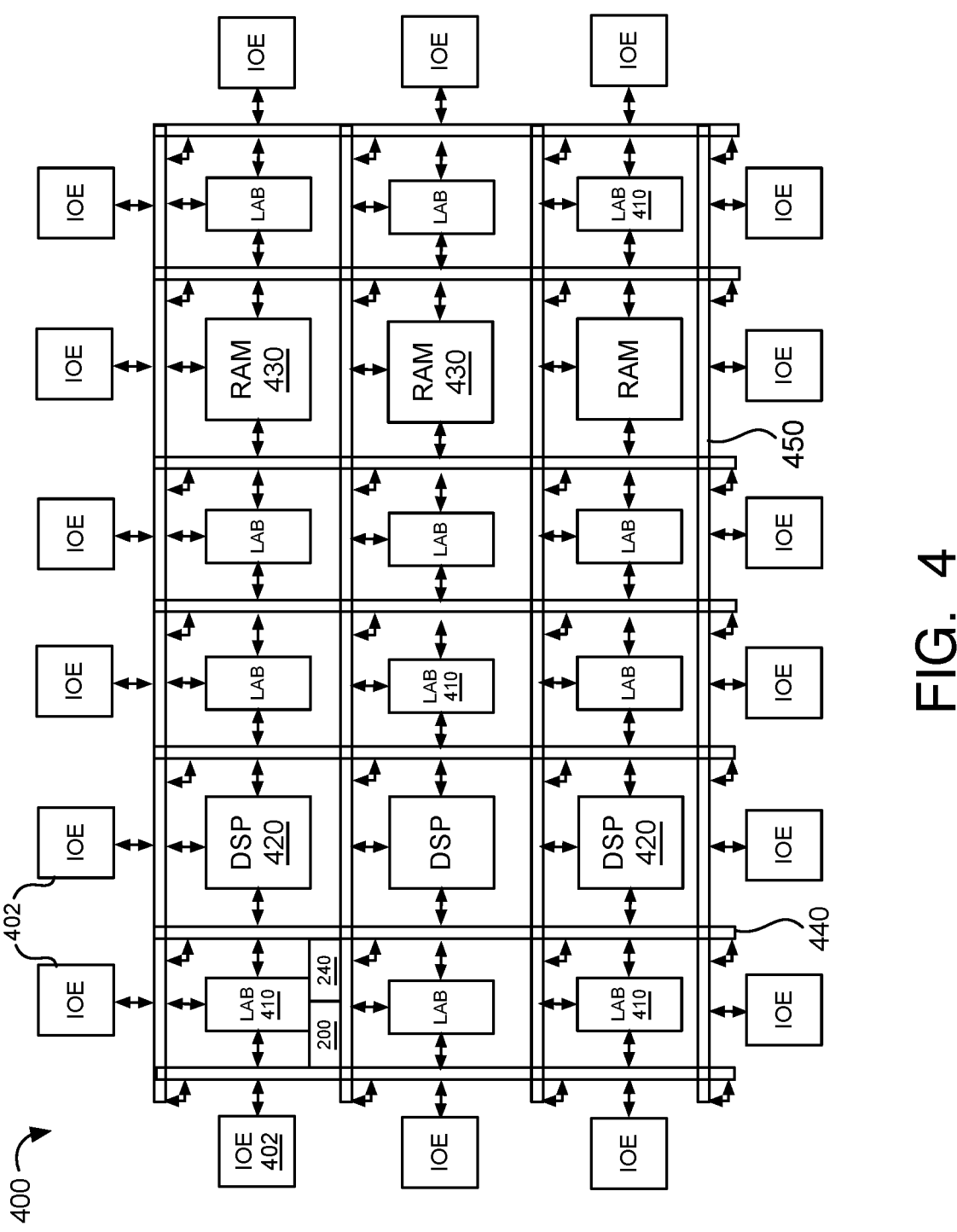
FIG. 4 is a diagram of an illustrative example of a programmable integrated circuit (IC) that includes the temperature dependent reference circuit and the voltage regulator circuit of FIG. 2.

FIG. 4 is a diagram of an illustrative example of a programmable integrated circuit (IC) 400 that includes the temperature dependent reference circuit (RC) 200 and the voltage regulator (VR) circuit 240 of FIG. 2. As shown in FIG. 4, the programmable integrated circuit 400 may include a two-dimensional array of functional blocks, including logic array blocks (LABs) 410 and other functional blocks, such as random access memory (RAM) blocks 430 and digital signal processing (DSP) blocks 420, for example. Functional blocks, such as LABs 410, may include smaller programmable regions (e.g., logic elements, configurable logic blocks, or adaptive logic modules) that receive input signals and perform custom functions on the input signals to produce output signals. In the example of IC 400, the temperature dependent reference circuit 200 and the voltage regulator circuit 240 reside in a logic sector, and the voltage regulator circuit 240 provides a supply voltage VCCHG to one or more programmable memory elements (e.g., having the storage circuits of FIG. 1) in one or more LABs 410 in the logic sector.

In addition, the programmable integrated circuit 400 may have input/output elements (IOEs) 402 for driving signals off of programmable integrated circuit 400 and for receiving signals from other devices. Input/output elements 402 may include parallel input/output circuitry, serial data transceiver circuitry, differential receiver and transmitter circuitry, or other circuitry used to connect one integrated circuit to another integrated circuit. As shown, input/output elements 402 may be located around the periphery of the IC. If desired, the programmable integrated circuit 400 may have input/output elements 402 arranged in different ways. For example, input/output elements 402 may form one or more columns of input/output elements that may be located anywhere on the programmable integrated circuit 400 (e.g., distributed evenly across the width of the programmable integrated circuit). If desired, input/output elements 402 may form one or more rows of input/output elements (e.g., distributed across the height of the programmable integrated circuit). Alternatively, input/output elements 402 may form islands of input/output elements that may be distributed over the surface of the programmable integrated circuit 400 or clustered in selected areas.

The programmable integrated circuit 400 may also include programmable interconnect circuitry in the form of vertical routing channels 440 (i.e., interconnects formed along a vertical axis of programmable integrated circuit 400) and horizontal routing channels 450 (i.e., interconnects formed along a horizontal axis of programmable integrated circuit 400), each routing channel including at least one track to route at least one wire.

Note that other routing topologies, besides the topology of the interconnect circuitry depicted in FIG. 4, may be used. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of programmable integrated circuit 400, fractional global wires such as wires that span part of programmable integrated circuit 400, staggered wires of a particular length, smaller local wires, or any other suitable interconnection resource arrangement.

Furthermore, it should be understood that examples disclosed herein may be implemented in any type of integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Programmable integrated circuit 400 may contain programmable memory elements. Memory elements may be loaded with configuration data (also called programming data) using input/output elements (IOEs) 402. Once loaded, the memory elements each provide a corresponding static control signal that controls the operation of an associated functional block (e.g., LABs 410, DSP 420, RAM 430, or input/output elements 402). The voltage regulator circuit 240 provides a supply voltage VCCHG to the programmable memory elements that store the configuration data.

In a typical scenario, the outputs of the loaded memory elements are applied to the gates of field-effect transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory or programmable memory elements.

The programmable memory elements may be organized in a configuration memory array consisting of rows and columns. A data register that spans across all columns and an address register that spans across all rows may receive configuration data. The configuration data may be shifted onto the data register. When the appropriate address register is asserted, the data register writes the configuration data to the configuration memory elements of the row that was designated by the address register.

Programmable integrated circuit 400 may include configuration memory that is organized in sectors, whereby a sector may include the configuration RAM bits that specify the function and/or interconnections of the subcomponents and wires in or crossing that sector. Each sector may include separate data and address registers.

In general, software and data for performing any of the functions disclosed herein may be stored in non-transitory computer readable storage media. Non-transitory computer readable storage media is tangible computer readable storage media that stores data for access at a later time, as opposed to media that only transmits propagating electrical signals (e.g., wires). The software code may sometimes be referred to as software, data, program instructions, instructions, or code. The non-transitory computer readable storage media may, for example, include computer memory chips, non-volatile memory such as non-volatile random-access memory (NVRAM), one or more hard drives (e.g., magnetic drives or solid state drives), one or more removable flash drives or other removable media, compact discs (CDs), digital versatile discs (DVDs), Blu-ray discs (BDs), other optical media, and floppy diskettes, tapes, or any other suitable memory or storage device(s).

One or more specific examples are described herein. In an effort to provide a concise description of these examples, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Additional examples are now described. Example 1 is an integrated circuit comprising: a diode for generating a temperature dependent voltage; a resistor divider for generating divided voltages by dividing the temperature dependent voltage; and a multiplexer circuit for selecting one of the divided voltages as a reference voltage used for generating a supply voltage for the integrated circuit.

In Example 2, the integrated circuit of Example 1 may optionally further comprise: a voltage regulator circuit for generating the supply voltage based on the reference voltage and for causing the supply voltage to vary based on variations in the reference voltage caused by variations in a temperature of the diode.

In Example 3, the integrated circuit of any one of Examples 1-2 may optionally further comprise: a first amplifier circuit for generating a first buffered voltage at a first terminal of the resistor divider using the temperature dependent voltage.

In Example 4, the integrated circuit of Example 3 may optionally further comprise: a second amplifier circuit for generating a second buffered voltage at a second terminal of the resistor divider using an additional reference voltage.

In Example 5, the integrated circuit of any one of Examples 1-4 may optionally further comprise: a bipolar junction transistor that comprises the diode.

In Example 6, the integrated circuit of Example 5 may optionally further comprise: a unity gain buffer circuit for generating a voltage at a base of the bipolar junction transistor using an input voltage.

In Example 7, the integrated circuit of any one of Examples 1-6 may optionally further comprise: a current mirror circuit for generating a current through the diode for generating the temperature dependent voltage.

In Example 8, the integrated circuit of Example 7 may optionally further comprise: a resistor coupled to the current mirror circuit; a transistor coupled to the resistor; and an amplifier coupled to a control input of the transistor, wherein the amplifier controls a current through the transistor and a current through the current mirror circuit.

In Example 9, the integrated circuit of any one of Examples 1-8 may optionally further comprise: a logic circuit comprising logic gates, wherein the supply voltage is provided to supply the logic circuit.

Example 10 is a method for generating a supply voltage, the method comprising: generating a temperature dependent voltage that varies based on variations in a temperature of a diode; generating divided voltages by dividing the temperature dependent voltage using a resistor divider; selecting one of the divided voltages as a reference voltage using a multiplexer circuit; and generating the supply voltage that varies in response to the temperature of the diode based on the reference voltage using a voltage regulator circuit.

In Example 11, the method of Example 10 may optionally include, wherein selecting one of the divided voltages as the reference voltage further comprises: selecting one of the divided voltages generated by the resistor divider as the reference voltage using the multiplexer circuit in response to select signals that are generated based on process variations of an integrated circuit that comprises the diode, the resistor divider, and the multiplexer circuit.

In Example 12, the method of any one of Examples 10-11 may optionally further comprise: generating a first buffered voltage at a first terminal of the resistor divider based on the temperature dependent voltage; and generating a second buffered voltage at a second terminal of the resistor divider based on an additional reference voltage.

In Example 13, the method of any one of Examples 10-12 may optionally include, wherein generating the temperature dependent voltage further comprises: generating a base voltage using a unity gain buffer circuit; and generating the temperature dependent voltage with a bipolar junction transistor in response to the base voltage being applied to a base of the bipolar junction transistor that comprises the diode coupled between an emitter and the base of the bipolar junction transistor.

In Example 14, the method of any one of Examples 10-13 may optionally include, wherein generating the temperature dependent voltage further comprises: generating a bias current through the diode using a current mirror circuit.

In Example 15, the method of Example 14 may optionally include, wherein generating the temperature dependent voltage further comprises: generating an input current through a transistor using an amplifier circuit in response to an input voltage, wherein the current mirror circuit generates the bias current through the diode based on the input current.

Example 16 is a circuit system comprising: a diode; a reference voltage generator circuit that generates reference voltages based on a voltage across the diode; a selector circuit that selects one of the reference voltages as a selected reference voltage; and a voltage regulator circuit that generates a supply voltage based on the selected reference voltage, wherein the voltage regulator circuit causes the supply voltage to vary with a temperature of the diode.

In Example 17, the circuit system of Example 16 may optionally include, wherein the reference voltage generator circuit comprises a resistor divider that generates the reference voltages.

In Example 18, the circuit system of any one of Examples 16-17 may optionally include, wherein the reference voltage generator circuit comprises: a first amplifier circuit that generates a first buffered voltage using the voltage across the diode; and a second amplifier circuit that generates a second buffered voltage using an additional reference voltage, wherein the reference voltage generator circuit generates the reference voltages using the first and the second buffered voltages.

In Example 19, the circuit system of any one of Examples 16-18 may optionally further comprise: a bipolar junction transistor that comprises the diode.

In Example 20, the circuit system of any one of Examples 16-19 may optionally further comprise: a current mirror circuit that generates a current through the diode.

The foregoing description of the examples has been presented for the purpose of illustration. The foregoing description is not intended to be exhaustive or to be limiting to the examples disclosed herein. In some instances, features of the examples can be employed without a corresponding use of other features as set forth. Many modifications, substitutions, and variations are possible in light of the above teachings.

What is claimed is:

1. An integrated circuit comprising:
a diode for generating a temperature dependent voltage;
a resistor divider for generating divided voltages by dividing the temperature dependent voltage;

a multiplexer circuit for selecting one of the divided voltages as a reference voltage used for generating a supply voltage for the integrated circuit; and
a logic circuit comprising logic gates, wherein the supply voltage is provided to supply the logic circuit.

2. The integrated circuit of claim 1 further comprising:
a voltage regulator circuit for generating the supply voltage based on the reference voltage and for causing the supply voltage to vary based on variations in the reference voltage caused by variations in a temperature of the diode.

3. The integrated circuit of claim 1 further comprising:
a first amplifier circuit for generating a first buffered voltage at a first terminal of the resistor divider using the temperature dependent voltage.

4. The integrated circuit of claim 3 further comprising:
a second amplifier circuit for generating a second buffered voltage at a second terminal of the resistor divider using an additional reference voltage.

5. The integrated circuit of claim 1 further comprising:
a bipolar junction transistor that comprises the diode.

6. The integrated circuit of claim 5 further comprising:
a unity gain buffer circuit for generating a voltage at a base of the bipolar junction transistor using an input voltage.

7. The integrated circuit of claim 1 further comprising:
a current mirror circuit for generating a first current through the diode for generating the temperature dependent voltage.

8. The integrated circuit of claim 7 further comprising:
a resistor coupled to the current mirror circuit;
a transistor coupled to the resistor; and
an amplifier coupled to a control input of the transistor, wherein the amplifier controls a second current through the transistor and the first current through the current mirror circuit.

9. The integrated circuit of claim 7 further comprising:
a unity gain buffer circuit coupled between the current mirror circuit and the resistor divider.

10. A method for generating a supply voltage, the method comprising:
generating a temperature dependent voltage that varies based on variations in a temperature of a diode by generating an input current through a transistor using an amplifier circuit in response to an input voltage and generating a bias current through the diode based on the input current using a current mirror circuit;
generating divided voltages by dividing the temperature dependent voltage using a resistor divider;
selecting one of the divided voltages as a reference voltage using a multiplexer circuit; and
generating the supply voltage that varies in response to the temperature of the diode based on the reference voltage using a voltage regulator circuit.

11. The method of claim 10, wherein selecting one of the divided voltages as the reference voltage further comprises:
selecting one of the divided voltages generated by the resistor divider as the reference voltage using the multiplexer circuit in response to select signals that are generated based on process variations of an integrated circuit that comprises the diode, the resistor divider, and the multiplexer circuit.

12. The method of claim 10 further comprising:
generating a first buffered voltage at a first terminal of the resistor divider based on the temperature dependent voltage; and generating a second buffered voltage at a second terminal of the resistor divider based on an additional reference voltage.

13. The method of claim 10, wherein generating the temperature dependent voltage further comprises:
generating a base voltage using a unity gain buffer circuit; and
generating the temperature dependent voltage with a bipolar junction transistor in response to the base voltage being applied to a base of the bipolar junction transistor that comprises the diode coupled between an emitter and the base of the bipolar junction transistor.

14. The method of claim 10, wherein generating the temperature dependent voltage further comprises:
generating the temperature dependent voltage using a bipolar junction transistor that comprises the diode.

15. The method of claim 10, wherein:
generating the input current through the transistor using the amplifier circuit in response to the input voltage, further comprises generating the input current through a resistor.

16. A circuit system comprising:
a diode;
a reference voltage generator circuit comprising a resistor divider that generates reference voltages based on a voltage across the diode;
a selector circuit that selects one of the reference voltages as a selected reference voltage;
a voltage regulator circuit that generates a supply voltage based on the selected reference voltage, wherein the voltage regulator circuit causes the supply voltage to vary with a temperature of the diode; and
a logic circuit comprising logic gates, wherein the supply voltage is provided to supply the logic circuit.

17. The circuit system of claim 16 further comprising:
a current mirror circuit for generating a first current through the diode;
a resistor coupled to the current mirror circuit;
a transistor coupled to the resistor; and
an amplifier coupled to a control input of the transistor, wherein the amplifier controls a second current through the transistor and the first current through the current mirror circuit.

18. The circuit system of claim 16, wherein the reference voltage generator circuit comprises:
a first amplifier circuit that generates a first buffered voltage using the voltage across the diode; and
a second amplifier circuit that generates a second buffered voltage using an additional reference voltage, wherein the reference voltage generator circuit generates the reference voltages using the first and the second buffered voltages.

19. The circuit system of claim 16 further comprising:
a bipolar junction transistor that comprises the diode.

20. The circuit system of claim 16 further comprising:
a current mirror circuit that generates a current through the diode.

* * * * *